United States Patent [19]

Imahashi

[11] Patent Number: 5,695,564
[45] Date of Patent: Dec. 9, 1997

[54] SEMICONDUCTOR PROCESSING SYSTEM

[75] Inventor: Issei Imahashi, Yamanashi-ken, Japan

[73] Assignee: Tokyo Electron Limited, Tokyo, Japan

[21] Appl. No.: 510,668

[22] Filed: Aug. 3, 1995

[30] Foreign Application Priority Data

Aug. 19, 1994 [JP] Japan .................. 6-218223

[51] Int. Cl.$^6$ .................................................. C23C 16/00
[52] U.S. Cl. .................. 118/719; 414/217; 414/939; 156/345; 204/298.25; 204/298.35
[58] Field of Search ................... 118/719; 156/345; 204/298.25, 298.35; 414/217, 939

[56] References Cited

U.S. PATENT DOCUMENTS

| | | | |
|---|---|---|---|
| 5,013,385 | 5/1991 | Maher | 156/345 |
| 5,076,205 | 12/1991 | Vowles | 118/719 |
| 5,135,608 | 8/1992 | Okutani | 156/345 |
| 5,186,718 | 2/1993 | Tepman | 29/25.01 |
| 5,217,501 | 6/1993 | Fuse | 29/25.01 |
| 5,259,881 | 11/1993 | Edwards | 118/719 |
| 5,286,296 | 2/1994 | Sato | 118/719 |
| 5,310,410 | 5/1994 | Begin | 29/25.01 |
| 5,404,894 | 4/1995 | Shiraiwa | 134/66 |
| 5,474,410 | 12/1995 | Ozawa | 414/217 |
| 5,538,390 | 7/1996 | Salzman | 414/786 |
| 5,562,383 | 10/1996 | Iwai | 414/217 |

FOREIGN PATENT DOCUMENTS

| | | | |
|---|---|---|---|
| 63-28863 | 2/1988 | Japan . | |
| 63-157870 | 6/1988 | Japan . | |
| 1-59354 | 12/1989 | Japan . | |
| 3-161929 | 7/1991 | Japan . | |
| 5-82620 | 4/1993 | Japan | 204/298.25 |
| 5-82623 | 4/1993 | Japan | 204/298.25 |

*Primary Examiner*—Richard Bueker
*Assistant Examiner*—Jeffrie R. Lund
*Attorney, Agent, or Firm*—Oblon, Spivak, McClelland, Maier & Neustadt, P.C.

[57] ABSTRACT

A multi-chamber type process system for processing semiconductor wafers is constituted such that a plurality of units selected from process units, transfer units, interconnection units and in/out units are connected via gate valves. Each of the units has a casing with one or more openings through which each of the wafers passes. The gate valve is attached to a flange provided at the opening, thereby connecting the openings openably and air-tightly. The openings are situated such that the units are connected in a direction defined in units of substantially 90°, and the direction of transfer of the wafers is defined in units of substantially 90°. Those of the openings of the casings of the units, which are not connected to the other openings of the casings, are air-tightly closed by blind plates such that the casings of the units form a vacuum chamber. The internal pressure of each of the casings of the units can be independently controlled.

14 Claims, 8 Drawing Sheets

SEMICONDUCTOR PROCESSING SYSTEM

BACKGROUND OF THE INVENTION

1. Field of the Invention

The present invention relates generally to a semiconductor process system and more particularly to a multi-chamber type semiconductor process system capable of successively carrying out a plurality of processing steps.

2. Description of the Related Art

In a process of manufacturing semiconductor devices, substrates to be processed, such as semi-conductor wafers and LCD substrates, are repeatedly subjected to a plurality of processing steps such as film formation steps and etching steps. Thus, semi-conductor devices are produced. Recently, attention has been paid to a multi-chamber process system, from the standpoint of mass-processing and higher throughput. The multi-chamber process system comprises a plurality of process units, and substrates are subjected to different treatments in the respective process units. Thus, the substrates are successively subjected to a plurality of steps.

For example, as shown in FIG. 11, Jap. Pat. Appln. KOKAI Publication No. 63-157870 discloses a typical multi-chamber process system wherein a plurality of substrate processing chambers 202 are arranged radially around a separation chamber 200. The processing chambers 202 communicate with the separation chamber 200 via gate valves 201. The separation chamber 200 is used to transfer, distribute and temporarily stay the substrates. In this radial arrangement type multi-chamber process system, however, a transfer system 203 is concentrated in the separation chamber 200. In the case where the number of arranged processing chambers is large or the processing rate in each processing chamber is high, the performance of the transfer system 203 in the separation chamber 200 is deficient and the through-put may decrease. In addition, the number of processing chambers to be arranged is limited owing to the shape of the separation chamber 200 and the degree of freedom of design is low. If a great number of processing chambers are to be arranged, the size of the separation chamber 200 arranged at the central region of the system must be increased. In this case, the installation space increases and a large-capacity cleaning room must be inevitably provided, resulting in an increase in initial cost. Furthermore, the increase in load on the evacuation system cannot be ignored. Besides, when different types of substrate processing chambers are to be arranged, a problem of cross-contamination among the processing chambers must be considered.

As is shown in FIG. 12, each of Jap. Pat. Appln. KOKAI Publications Nos. 63-28863 and 3-161929 discloses a multi-chamber type process system of "passage arrangement type" wherein a plurality of process systems 212 are successively arranged on both sides of a transfer passage 210 and the process systems 212 communicate with the passage 210 via gate valves 211. In this system, as compared to the above-described radial arrangement type system, the volume of the transfer passage 210 (corresponding to the separation chamber 200) can be reduced in the case where the number of arranged processing chambers is large. However, because of the shape of the transfer passage 210, the number of processing chambers to be arranged is limited and the degree of freedom of design is low. Furthermore, the volume of the transfer passage 210 is still large, although smaller than the volume of the separation chamber 200 in the radial arrangement type system. Thus, the load on the evacuation system is great.

Jap. Pat. Appln. KOKOKU Publication No. 1-59354 discloses a process system which is different from the above-described radiation arrangement type system or passage arrangement type system. This system comprises a combination of processing chambers each provided with a plurality of transfer systems, thereby enhancing the through-put and simplifying the structure. In this process system, however, a plurality of transfer systems must be provided for each processing chamber. Consequently, if the number of arranged processing chambers is great, the degree of freedom of design decreases and unnecessary transfer systems are provided.

In particular, in the case of constituting a multi-chamber type process system for processing large-size substrates such as 8-inch or larger wafers (e.g. 12-inch wafers) and LCD substrates, there are problems of an increase in installation space due to a larger size of the apparatus and an increase in volume of a clean room. There is a demand for a process system with a smaller installation space and a higher degree of freedom of design.

SUMMARY OF THE INVENTION

An object of the present invention is to provide a multi-chamber type semiconductor process system which can be freely designed and arranged according to the type and number of process steps or an installation space, without greatly increasing costs.

Another object of the invention is to provide a multi-chamber type semiconductor process system wherein an excessive load is not applied to a specific vacuum exhaust system even if the number of assembled vacuum process chambers is large.

Still another object of the invention is to provide a multi-chamber type semiconductor process system capable of performing, during transfer of substrates, a specific process such as simple pretreatment, after-treatment, tests, or alignment.

Still another object of the invention is to provide a multi-chamber type semiconductor process system in which a problem of cross contamination is solved.

According to a first aspect of the invention, there is provided a semiconductor process system for processing a plurality of substrates, comprising:

first and second process units each having a process casing with at least one opening through which each of the substrates can pass, support means for supporting each of the substrates within the process casing, and means for subjecting each of the substrates to a semiconductor process within the process casing;

first and second transfer units each having a transfer casing with at least four openings through which each of the substrates can pass, and a transfer arm, provided within the transfer casing, for transferring each of the substrates, the first and second transfer units being connected to the first and second process units via joints, respectively, the joints connecting the adjoining-openings of the two associated units openably and air-tightly;

an interconnection unit having an interconnection casing with at least two openings through which each of the substrates can pass, and a table, provided within the interconnection casing, for supporting each of the substrates, the interconnection unit being connected to the first and second transfer units via joints, the joints connecting the adjoining openings of the two associated units openably and air-tightly; and an in/out unit having an in/out casing with at least one opening through which each of the substrates can pass, and vertical movement means for vertically moving at least one cassette storing the substrates at intervals within the in/out casing, the in/out unit being connected to the first transfer unit via a joint, the joint connecting the adjoining openings of the two associated units openably and air-tightly, wherein the opening of each of the units is situated such that the units are connected in directions defined in units of substantially 90°, and the direction of transfer of the substrates is defined in units of substantially 90°, and those of the openings of the casings of the process units, the transfer units and the interconnection unit, which are not connected to any of the other openings of the casings, are air-tightly closed by blind plates such that each of the casings of the process units, the transfer units and the interconnection unit form a vacuum chamber.

According to a second aspect of the invention, there is provided a semiconductor process system for processing substrates, wherein the process system is constituted such that at least two process units, at least two transfer units, at least one interconnection unit and at least one in/out unit, selected from among a plurality of process units, a plurality of transfer units, a plurality of interconnection units and a plurality of in/out units, are connected via joints, each of the units has a casing with one or more openings through which each of the substrates pass, and each of the joints connect the adjoining openings of the two associated units openably and air-tightly, the opening of each of the units is situated such that the units are connected in directions defined in units of substantially 90°, and the direction of transfer of the substrates is defined in units of substantially 90°, those of the openings of the casings of the selected process units, transfer units and interconnection unit, which are not connected to any of the other openings of the casings, are air-tightly closed by blind plates such that each of the casings of the selected process units, transfer units and interconnection unit form a vacuum chamber, each of the process units has at least one opening, support means for supporting each of the substrates within the casing thereof, and means for subjecting each of the substrates to a semiconductor process within the casing thereof, each of the transfer units has at least four openings, and a transfer arm, provided within the casing, for transferring each of the substrates, each of the process units being connected to one transfer unit via the joint, each of the interconnection units has at least two openings and a table, provided within the casing thereof, for supporting each of the substrates, each of the interconnection units is connected to at least one of the transfer units via the joint, and at least one of the interconnection units is interposed between two of the transfer units, and each of the in/out units has at least one opening and vertical movement means for vertically moving at least one cassette for storing the substrate at intervals within the casing thereof, each of the in/out units being connected to at least one of the transfer units via the joint.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Figure 1:
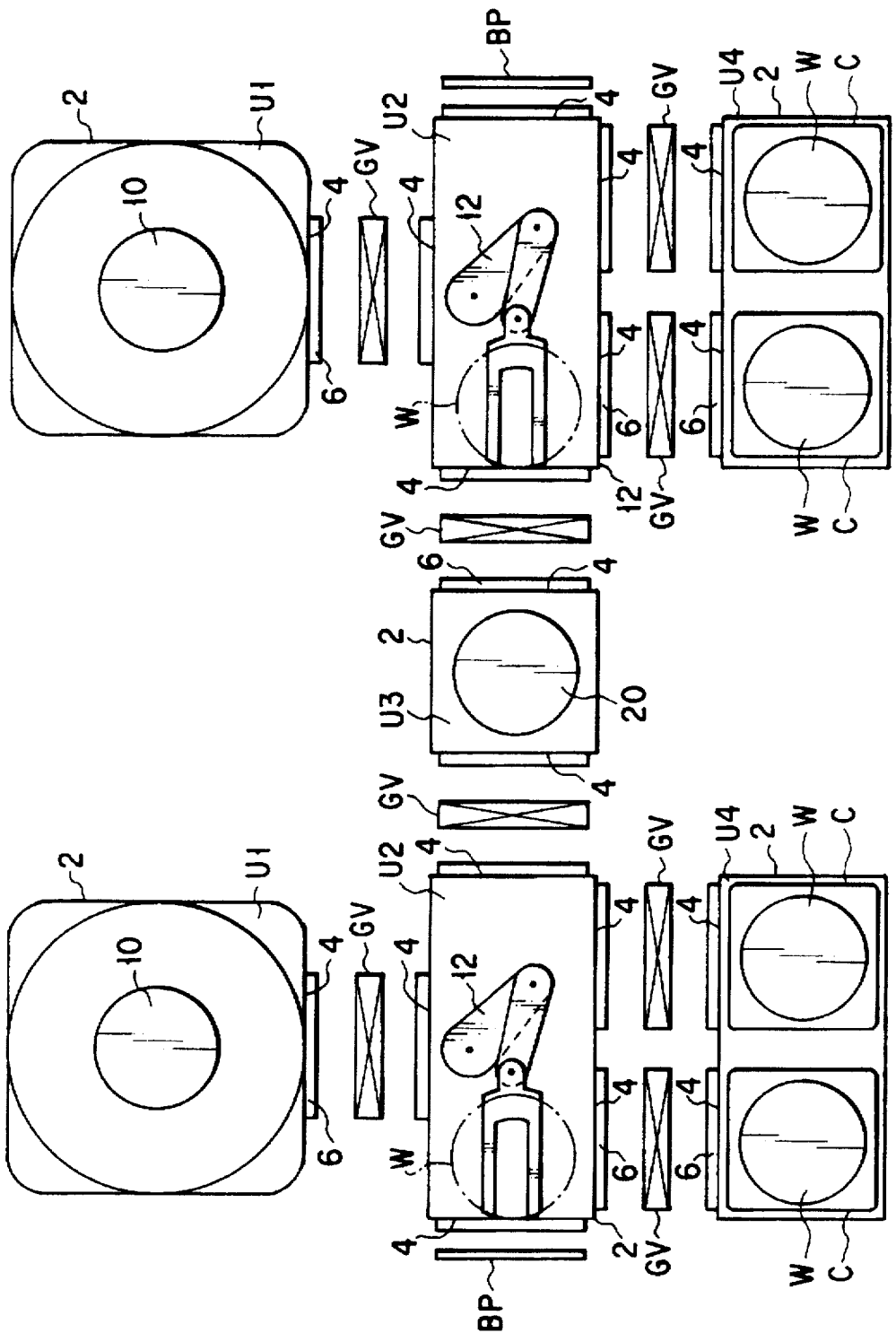
FIG. 1 is a plan view showing a multi-chamber type process system according to an embodiment of the present invention, in the state in which the process system is disassembled into basic units.

FIG. 1 is a plan view showing a multi-chamber type process system according to an embodiment of the present invention, in the state in which the process system is disassembled into basic units. The basic units include a large-size process unit U1, a transfer unit U2, a linear interconnection unit U3 and a two-cassette storing in/out unit U4.

Figure 2:
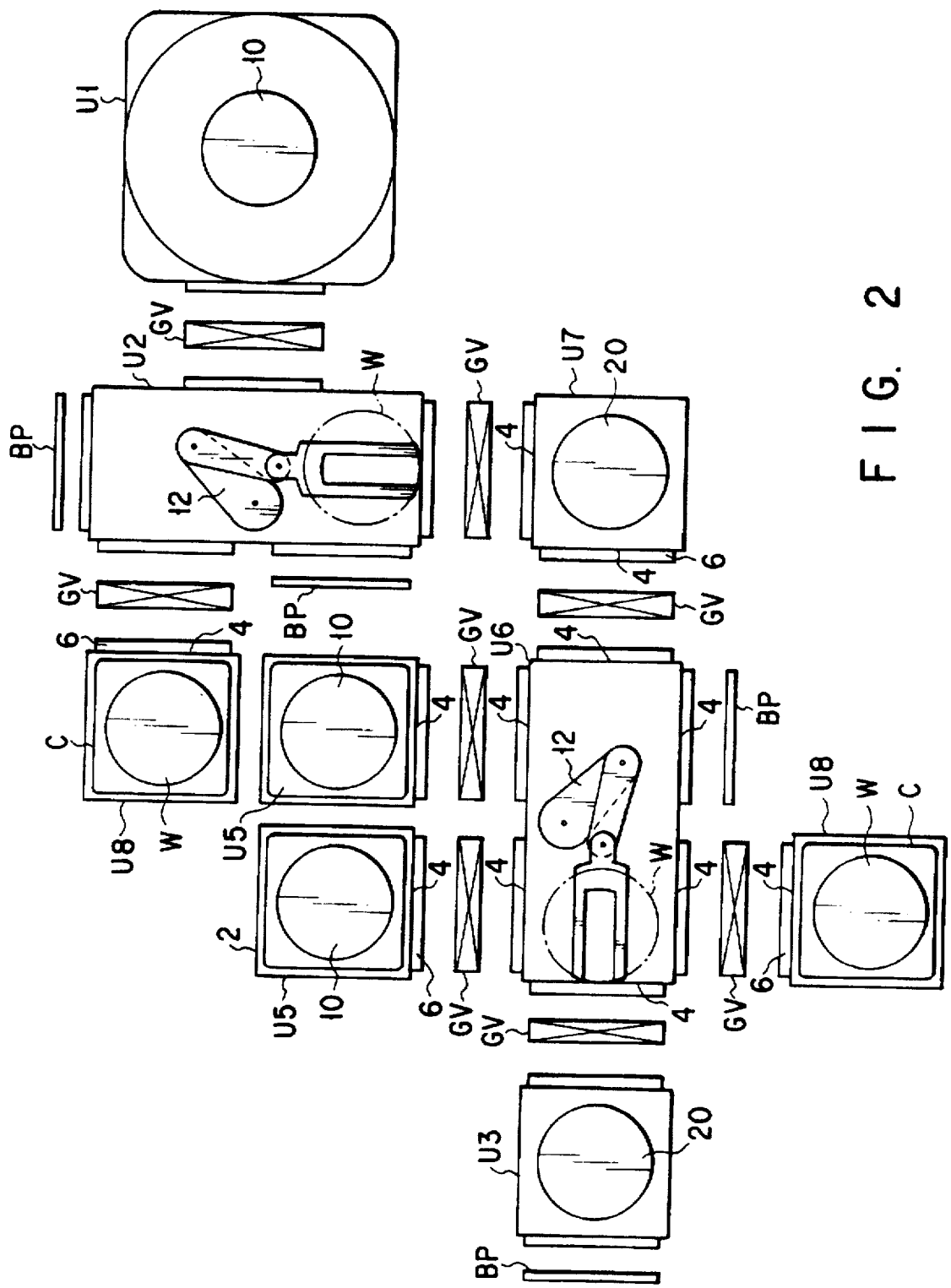
FIG. 2 is a plan view showing a multi-chamber type process system according to another embodiment of the present invention, in the state in which the process system is disassembled into basic units.

FIG. 2 is a plan view showing a multi-chamber type process system according to another embodiment of the present invention, in the state in which the process system is disassembled into basic units. In addition to the basic units U1 to U4 used in the process system shown in FIG. 1, this system includes a small-size process unit U5, a transfer unit U6 for attaching the small-size process unit U5, a direction-changing interconnection unit U7, and a one-cassette storing in/out unit U8.

Each of the units U1 to U8 is basically designed to have an installation floor space corresponding to a low integer number (four or less in the embodiments) of times of a reference square RS (L×L) having each side L, which is chosen according to the dimensions of semiconductor wafers W or substrates to be processed. In other words, each unit, U1 to U8, is substantially provided with an area of N times of the reference square RS with each side L defined by grids of orthogonal coordinate system on plan views (N=a positive integer; N=1, 2, 4 in the embodiments shown in FIGS. 1 and 2).

It is said from another viewpoint that the units U1 to U8 are successively connected in directions defined in units of about 90°. The direction of transfer of the semiconductor wafers W or substrates to be processed is determined in units of about 90°. Specifically, the transfer path of the semiconductor wafers W or substrates to be processed is substantially defined to extend forward, backward or to the right or left at 90°. More specifically, adjacent three units are connected at 0° or 180° to form a substantially linear transfer path, or are connected at 90° or 270° to form a transfer path bent at substantially 90°.

Each of the units U1 to U8 has a casing 2 of a pressure-resistant structure with one or more openings 4. Each opening 4 is provided with a flange 6. When each opening 4 is air-tightly closed via the flange 6, each casing 2 constitutes a vacuum chamber. The casing 2 of each of the units U1 to U8 is connected to a line from an inert gas supply system 7 and a line from an exhaust system 8 (see FIG. 3). Thus, in the state in which each casing 2 constitutes a vacuum chamber, the vacuum chamber of each of the units U1 to U8 can be individually made to have a predetermined negative pressure atmosphere.

The units U1 to U8 are connected to each other through a gate valve GV functioning as an air-tight joint and an opening/closing means. The flanges 6 of the units U1 to U8 have the same or common mounting dimensions so that the same gate valves GV can be attached. Accordingly, the gate valves GV used in the present process system are substantially the same. However, the valves may have different withstand pressures, depending on the required withstand pressures in the respective units. In addition, the openings 4 of the unit U1 to U8 have the same dimensions. The openings 4, which are not used for connection among the units U1 to U8, are air-tightly closed by blind plates BP attached to the flanges 6.

The process system shown in FIG. 1 is provided with two large-size process units U1, and the process system shown in FIG. 2 is provided with one large-size process unit U1. The process unit U1 is designed to have a square installation space defined by multiplying the aforementioned reference square RS with each side L by 2×2. Specifically, when the units U1 to U8 are connected, the process unit U1 requires 2×2 reference squares RS. However, each side of the casing 2 of the process unit U1 is much less than 2L.

The process system shown in FIG. 2 is provided with two small-size process units U5. The process unit U5 is designed to have an installation space defined by one reference square RS. If the substrate to be processed is small or the process requires less equipment, such a small-size process unit U5 may be sufficient.

The casings 2 of the process units U1 and U5 have substantially square planar shapes. One side face of each casing 2 is provided with one opening 4 such that a vertical central line of the side face is set as a line of symmetry. A table 10 for supporting semiconductor wafers W is disposed in a central region of the casing 2 of each of the process units U1 and U5. Vertically movable lift pins (not shown) are provided within the table 10 in order to assist the loading/ unloading of the wafers W. The two process units U1 shown in FIG. 1 or the two process units U5 shown in FIG. 2 can perform, for example, the same process or different processes such as a film forming process and an etching process. The structures of the process units U1 and U5 associated with the respective processes will be described later in detail.

The planar shape of the process unit U1 is not limited to a square shape, but may be, e.g. a rectangular shape, a circular shape or a polygonal shape. In addition, a plurality of openings 4 may be provided.

The large-size process units U1 are respectively connected to substantially identical transfer units U2. The two small-size process units U5 are connected to one common transfer unit U6. Each of the transfer units U2 and U6 is designed to have a rectangular installation space defined by 1×2 reference squares RS. In other words, the casing 2 of each of the transfer units U2 and U6 has a rectangular planar shape.

The casing 2 of the transfer unit U2 has five openings 4. More specifically, each of both end faces and one side face is provided with one opening 4 such that a vertical central line thereof is set as a line of symmetry, and the other side face is provided with a pair of openings 4 with a vertical central line thereof set as a line of symmetry. On the other hand, the casing 2 of the transfer unit U6 has six openings 4. More specifically, each of both end faces is provided with one opening 4 such that a vertical central line thereof is set as a line of symmetry, and each of both side faces is provided with a pair of openings 4 such that a vertical central line thereof is set as a line of symmetry. It is desirable that each of the transfer units U2 and U6 be provided with at least four openings 4, respectively, in four directions at an angular interval of substantially 90°.

Figure 3:
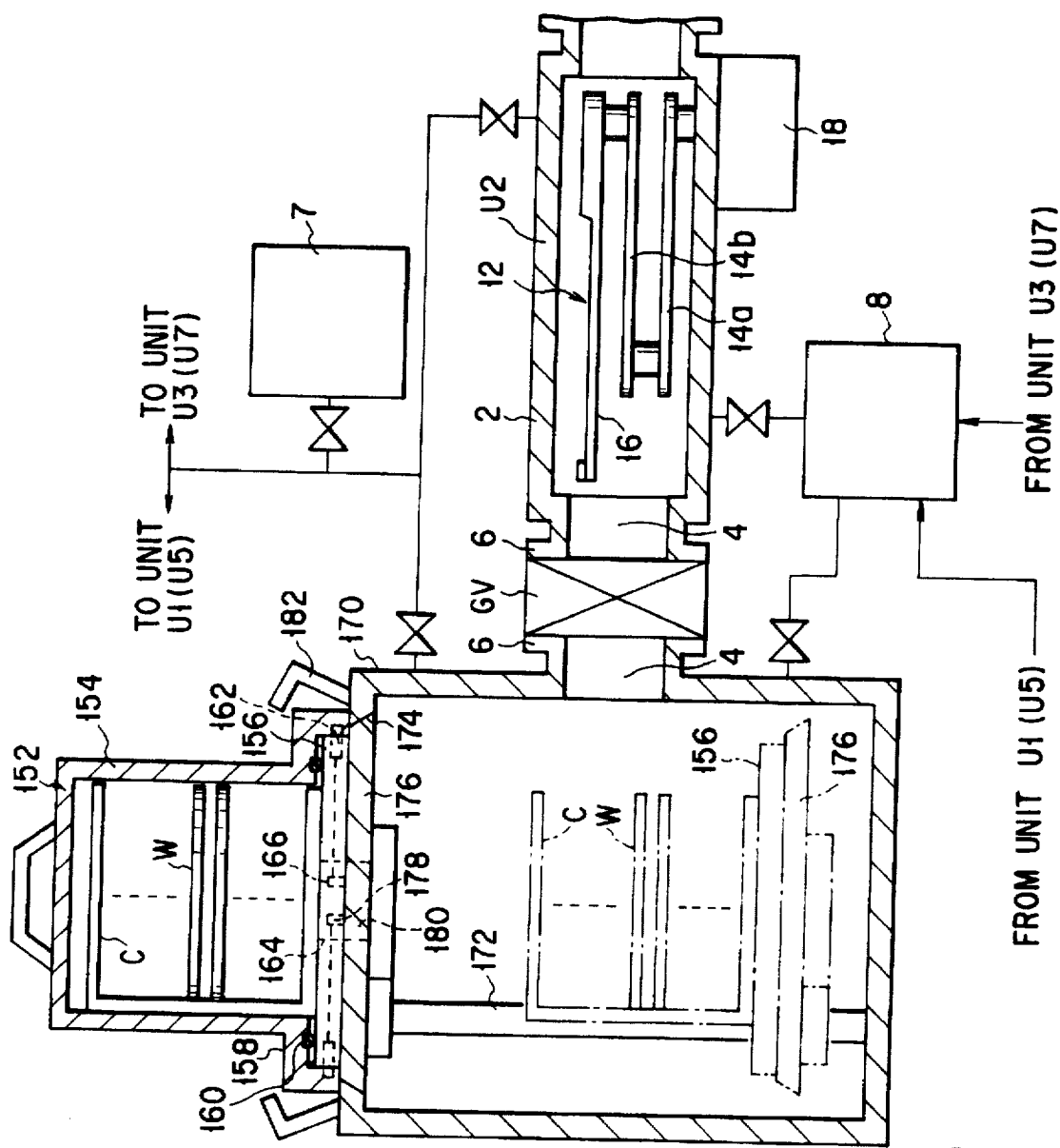
FIG. 3 is a cross-sectional view showing the relationship between a transfer unit and an in/out unit.

As is shown in FIG. 3, an extendible transfer arm 12 is provided in the casing 2 of the transfer unit U2, U6. The transfer arm 12 comprises arm elements 14a and 14b and a fork 16 coupled by a link mechanism. The transfer arm 12 is not only extended but also vertically moved by a driving unit 18. The transfer arm 12 transfers wafers W among the units U1 to U8 via the openings 4 of the transfer units U2 and U6.

In the process system shown in FIG. 1, an interconnection unit U3 is provided to connect the two transfer units U2, thereby forming a linear transfer path. In the process system shown in FIG. 2, an interconnection unit U7 is provided to connect the two transfer units U2 and U6, thereby forming a transfer path bent at 90°. Each of the interconnection units U3 and U7 is designed to have an installation space defined by one reference square RS. Specifically, the casing 2 of each of the interconnection units U3 and U7 has a square planar shape.

Each of two opposed faces of the casing 2 of the interconnection unit U3 for the linear transfer path is provided with one opening 4 such that the vertical central line thereof is set as a line of symmetry. On the other hand, each of two adjacent faces of the casing 2 of the interconnection unit U7 for the diverting transfer path is provided with one opening 4 such that the vertical central line thereof is set as a line of symmetry.

A table 20 for supporting the semiconductor wafers W is provided within the casing 2 of each of the interconnection units U3 and U7. Vertically movable lift pins (not shown) are provided within the table 20 in order to assist the loading/ unloading of the wafers W. Each of the interconnection units U3 and U7 not only functions to temporarily store the wafers W between the two transfer units U2, but can function to perform a test, temperature regulation, heat treatment, alignment, etc. for the wafers W. For example, an interconnection unit U3 is provided at the left end portion of the process system in FIG. 2 in order not to connect the transfer unit U2 but to perform a designated function.

In the process system shown in FIG. 1, two substantially identical in/out units U4 are connected to the two transfer units U2, respectively. The in/out unit U4 is designed to have a rectangular installation space defined by 1×2 reference squares RS and to contain two wafer cassettes C. Each wafer cassette C stores a plurality of semiconductor wafers W, e.g. 25 wafers W. On the other hand, in the process system shown in FIG. 2, two in/out units U8 are connected to the two transfer units U2 and U6, respectively. The in/out unit U8 is designed to have an installation space defined by one reference square RS and to contain one wafer cassette C.

When the two in/out units U4 and U8 are used, as shown in FIG. 2, one of them is normally used to put non-processed wafers W into the system and the other is used to take out the processed wafers W from the system. However, in some cases, one of the wafer cassettes C of the in/out unit U4 is used to put non-processed wafers W into the system and the other wafer cassette C is used to take out the processed wafers W from the system. In other cases, one of the wafer cassettes C is used both to put non-processed wafers W into the system and to take the processed wafers W out of the system.

In order to prevent formation of a natural oxide film on the washed surface of the wafer W, the wafer cassette C is put in an air-tight cassette container 152 filled with an inert gas and transferred to the present process system. Each of the in/out units U4 and U8 is constituted so as to be capable of taking the air-tightly sealed wafer cassette C into the casing 2 thereof, without exposing the cassette C to the outside air.

More specifically, the cassette container 152 comprises a rectangular container body 154 having an open end at the bottom, and a detachable bottom plate 156 for air-tightly closing the open end. The bottom plate 156 is air-tightly attached to the lower face of a flange 158 provided at a lower part of the container body 154, with a sealing member such as an O-ring 160 interposed. The container 152, in which the cassette C is contained, is filled with a clean inert gas such as nitrogen at a positive pressure with respect to the atmospheric pressure. Thus, a nozzle (not shown) with a valve for introducing a gas is connected to the container 152.

A plurality of projectable/retreatable lock pins 162 are provided within a peripheral surface portion of the bottom plate 156. The lock pins 162 are engaged with recesses formed in a lower part of the inner wall of the container body 154. The lock pins 162 are coupled to a disk 164 disposed in a central portion of the bottom plate 156. When the disk 164 is rotated, the pins 162 are engaged with and disengaged from the recesses in the container body 154. A bottom portion of the disk 164 is provided with recesses 166 for rotating the disk 164.

On the other hand, an opening 174 is formed in a top plate 170 of the casing 2 of the in/out unit U4, U8, by which the cassette container 152 is supported. The opening 174 is opened and closed by a lid 176 which is vertically moved within the casing 2 of the in/out unit U4, U8 by means of a ball screw 172. A plurality of upwardly projecting pins 178 are provided on a central portion of the upper surface of the lid 176. The pins 178 are attached to a rotational driving member 180 disposed within the lid 176 and can be engaged in the recesses 166 in the bottom plate 156. Specifically, when the rotational driving member 180 is rotated in the state in which the pins 178 are engaged in the recesses 166, the disk 164 of the bottom plate 156 is also rotated and the lock pins 162 are engaged with and disengaged from the container body 154.

A plurality of clamps 182 are provided on the upper surface of the top plate 170 around the opening 174. The clamps 182 are engaged with the upper surface of the flange 158 of the container body 154, thereby pressing the container body 154 upon the top plate 170 of the casing 2. A seal member (not shown) such as an O-ring is provided between the container body 154 and the top plate 170 of the casing 2. Thus, the container body 154 and the top plate 170 are air-tightly sealed.

As regards the in/out unit U4, U8 of the above structure, when the non-processed wafers W are to be put in the process system, the cassette container 152 is at first placed on a predetermined position on the top plate 170. Then, the clamps 182 are rotated to air-tightly fix the container body 154 on the top plate 170. Subsequently, the rotational driving member 180 of the lid 176 is rotated and the lock pins 162 are disengaged by means of the disk 164 of the bottom plate 156 of the cassette container 152. The lid 176 is lowered and the bottom plate 156 and wafer cassette C are lowered while the container body 154 is left on the top plate 170. Thus, the cassette C is put in the casing 2 of the in/out unit U4, U8 so that the non-processed wafers W can be handled by the transfer arm 12 of the transfer unit U2.

When the processed wafers W are to be taken out of the process system, the wafer cassette C containing the processed wafers W is restored into the container body 154 fixed on the top plate 170, in a manner reverse to the above described manner. In this case, if the casing 2 of the in/out unit U4, U8 is filled with an inert gas, the cassette C containing the processed wafers W can be put into the cassette container 152 in the state in which the cassette container 152 is filled with the inert gas.

In this manner, a closed space free from influence of the outside atmosphere can be formed in the present process system from the take-in of the non-processed wafers W to the take-out of the processed wafers W. Accordingly, there is no need to place the process system in a clean room with high cleanness. In other words, since there is no need to provide a large-capacity clean room with high cleanness for accommodating the present process system, the initial cost for constituting the process system can be remarkably reduced.

Figure 4:
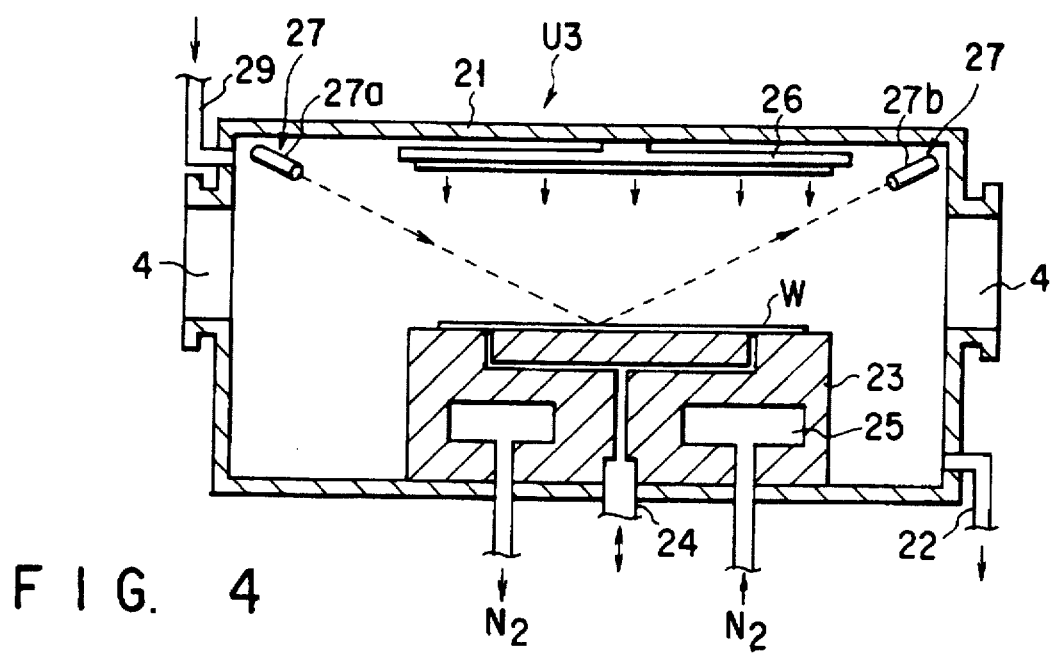
FIG. 4 is a cross-sectional view showing in detail an interconnection unit.

With reference to FIG. 4, a specific example of the interconnection unit U3 (U7) will now be described in detail. In the interconnection unit U3 shown in FIG. 4, a table 23 is disposed within an air-tight casing 21 formed of stainless steel or aluminum. Vertically movable lift pins 24 are provided within the table 23. The lift pins 24 are raised to receive a wafer W. After the lift pins 24 receive the wafer W by means of a specified transfer arm, the lift pins 24 lower and the wafer W is placed on the support surface of the table 23. The support surface of the table 23 may be provided with wafer fixing means such as an electrostatic chuck on an as-needed basis.

A cooling jacket 25 may be provided within the table 23. A refrigerant such as liquid nitrogen is circulated from a refrigerant source (not shown) through the cooling jacket 25. The wafer W may be cooled down to a desired temperature by cold transmission through the cooling jacket 25. Heating means 26 such as an infrared lamp may be situated above the wafer W. The wafer W may be heated up to a desired temperature. In this manner, the temperature control means for controlling the temperature of the taken-in wafer W at a desired level may be provided within the interconnection unit U3. For example, in the front-stage process unit, the heat-treated wafer W may be cooled to room temperature during transfer, or the wafer W, during transfer, may be heated for simple annealing treatment. An electric resistance body may be provided within the table 23 in place of the infrared lamp as heating means 26.

The interconnection unit U3 may be provided with a testing device 27, such as a grazing incidence interferometer, a capacitance type testing device, a Fizeau interferometer, a photoelectric testing device, or an ultrasonic testing device. Thereby, the surface shape of the processed wafer W, e.g. flatness, warp, thickness, etc. may be measured and tested. Moreover, if necessary, the interconnection unit U3 may be provided with an optical densitometer, a visible ultraviolet spectrophotometer, an infrared spectrophotometer, a scanning tunneling electron microscope, an Auger electron microscope, a tracing type film thickness meter, an ellipsometer, a scanning electron microscope, an EPMA, a foreign matter testing device. Thereby, the physical properties of the wafer W can be examined in detail. If a serious defect is found, the rear-stage process may be omitted and the defective wafer W can be unloaded to the outside of the system. The interconnection unit U3 shown in FIG. 4 is provided with a grazing incidence interferometer as an example of testing device 27. A radiation beam of a specific wavelength emitted from a light emission element 27a is reflected on the surface of the wafer W and received by a light receiving element 27b. The state of the surface of the wafer W is tested on the basis of an interference waveform of the received light.

A process gas introducing system 29 and exhaust system 22 are connected to the interconnection unit U3, if necessary. Thereby, a predetermined gas, e.g. nitrogen gas, may be introduced to form a nitride film on the surface of the processed wafer W, thereby protecting the processed surface. Furthermore, position adjusting means for adjusting the position of the wafer W may be provided on the table 23 of the interconnection unit U3, if necessary. Thus, the wafer W pre-aligned by the interconnection unit may be transferred to the rear-stage process unit.

Besides, a vertically movable cassette may be provided within the interconnection unit U3, and about 25 wafers may be temporarily stored in the cassette.

The functions which can be provided on the interconnection unit U3 are not limited to the above. The interconnection unit U3 may have one or more of functions to perform any kind of process, any kind of test, alignment, temperature control, etc. which can be performed while the substrate is being transferred from the front-stage process step to the rear-stage process step. Inversely, the interconnection unit U3 may not have any additional function, and may be constituted as a simple interconnection unit, the pressure of which can be controlled independently from the other units. In the interconnection unit U3 for the linear transfer path, two openings 4 are arranged opposite to each other. In the interconnection unit U7 for the diverting transfer path, two openings 4 are arranged so as to define 90° therebetween.

Specific examples of the process units U1 and U5 will now be described with reference to FIGS. 5, 6 and 7.

Figure 5:
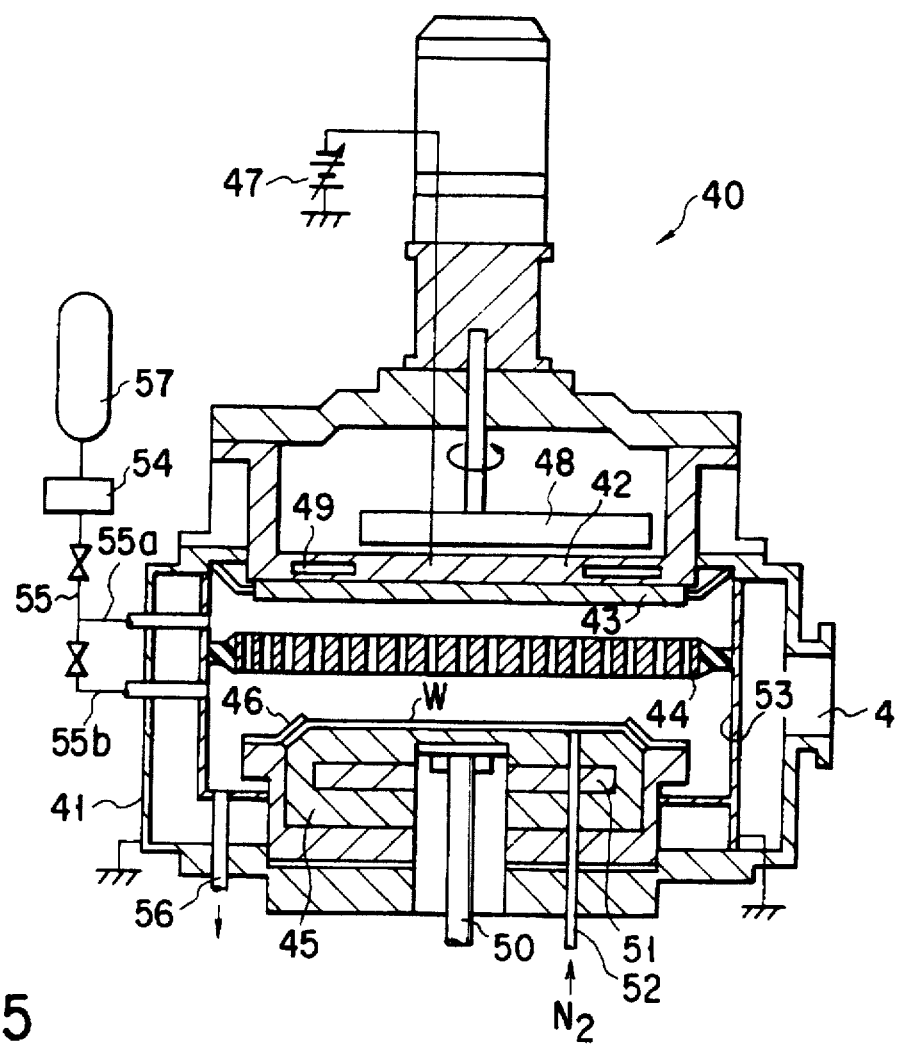
FIG. 5 is a cross-sectional view showing a sputtering apparatus which can be used as a process unit.

FIG. 5 shows a magnetron type sputtering apparatus 40 used as process unit U1, U5. As is shown in FIG. 5, the sputtering apparatus 40 includes an air-tight barrel-shaped casing 41 formed of stainless steel, aluminum, etc. A cathode 42, a target 43, a collimator 44 and an anode 45 are arranged within the casing 41 in this order from the above such that they face one another. The anode 45 functions also as a table for supporting and fixing the semiconductor wafer W or the substrate to be processed, and the wafer W is fixed on the support surface of the table by means of a chuck 46.

The cathode 42 formed of a conductive metal is connected to a variable DC high-voltage power supply 47. At the time of a sputtering process, a DC power of, e.g. 10 to 20 KW is applied and a glow discharge is caused between the cathode 42 and anode 45. Ion particles are made to impinge upon the target 43 bonded to the lower surface of the cathode 42, and sputtered particles are deposited on the surface of the wafer W to be processed, which is situated opposite to the target 43. A rotatable permanent magnet 48 is situated above the cathode 42. A traverse electromagnetic field is formed near the cathode 42 by the permanent magnet 48, and secondary ions are trapped. Thus, ionization is facilitated. By varying the arrangement and/or shape of the permanent magnet 48, a variance in thickness of the formed film can be adjusted. A cooling jacket 49 is provided within the cathode 42, and a refrigerant, e.g. cool water, is circulated in the jacket 49, thereby preventing an increase in temperature of the cathode 42 and/or target 43.

A table 45 serving also as an anode and formed of an electrically conductive material such as aluminum is situated below the casing 41. The table 45 is formed substantially cylindrical and can be vertically moved by an elevating mechanism 50. A heating device 51 such as a heater is provided within the table 45, and the wafer W can be heated up to a desired temperature, e.g. 200° C. Nitrogen gas, etc. can be supplied to the bottom face of the wafer W via a tube 52, thereby enhancing heat conduction of heat from the heating device 51.

A collimator 44 is situated between the cathode 42/target 43 and the anode (table) 45. The collimator 44 is formed of a conductive metal such as stainless steel in a disk shape and provided with many pores in a honeycomb manner or with many pores each having a circular cross section. An insulating member of, e.g. ceramic material is attached to the periphery of the collimator 44. Thus, the collimator 44 is electrically insulated from the inner wall of the casing 41 and a shield 53. At the time of the process, the collimator 44 is set in an electrically floating state. The shield 53 of, e.g. stainless steel is formed within the casing 41 so as to surround a space from the cathode 42 to the anode (stable) 45, where the sputtering particles fly. Thus, the inner wall of the casing 41 is protected against the sputtering particles. Since the shield 53 is grounded, it can function as a kind of counter electrode at the time of the process.

A process gas introducing pipe 55 for supplying a desired process gas to the casing 41 from a gas source 57 via a mass flow controller 54 is connected to the casing 41. For example, an inert gas such as argon gas is introduced through a first path 55a as a predetermined process gas, and a reactive gas such as nitrogen is introduced through a second path 55b. An exhaust port 56 is formed in a lower part of the casing 41, and the inside of the casing 41 is evacuated to a desired pressure level by means of a vacuum pump (not shown), e.g. a dry pump.

Figure 6:
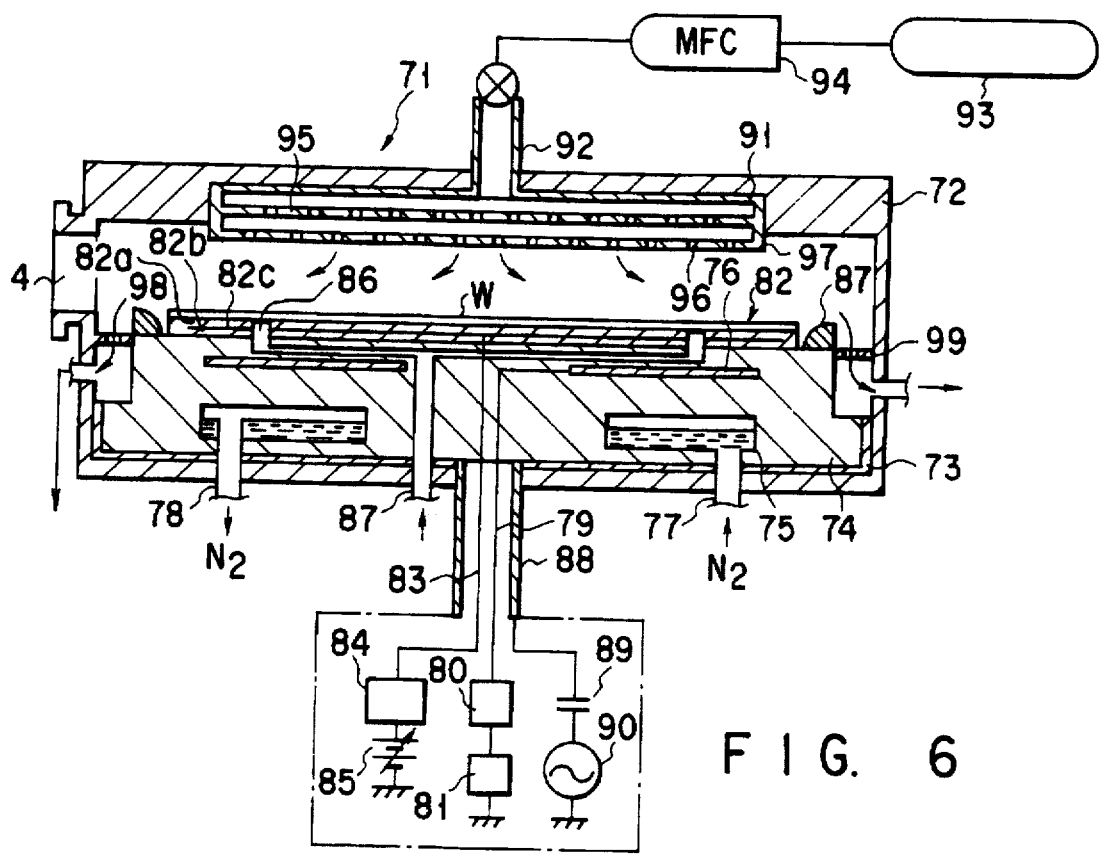
FIG. 6 is a cross-sectional view showing an etching apparatus which can be used as a process unit.

FIG. 6 shows a plasma etching apparatus 71 used as process unit U1, U5. The etching apparatus 71 has an air-tight casing 72 formed of, e.g. aluminum in a cylindrical or rectangular shape. A substantially cylindrical table 74 for supporting wafers W is accommodated in a bottom region of the casing 72, with an insulator 73 of, e.g. a ceramic material interposed. The table 74 can be constituted by assembling a plurality of members formed of, e.g. aluminum by using bolts, etc. Heat source means such as cooling means 75 or heating means 76 is provided within the table 74, thereby to set the processing surface of the wafer W at a desired temperature.

The cooling means 75 comprises, e.g. a cooling jacket. A refrigerant such as liquid nitrogen can be introduced into the cooling jacket 75 via a refrigerant cooling pipe 77. The introduced liquid nitrogen is circulated in the cooling jacket 75, and during the circulation, cooling occurs due to nuclear boiling. With this structure, cold of, e.g. liquid nitrogen at −196° is transmitted from the cooling jacket 75 to the wafer W via the table 74 and the processing surface of the wafer W is cooled to a desired temperature. The nitrogen gas generated by the nuclear boiling of the liquid nitrogen is exhausted to the outside via a refrigerant exhaust pipe 78.

The heating means 76, e.g. a temperature control heater, is disposed on the table 74. The temperature control heater 76 is constituted, for example, such that a conductive resisting heat generating body of, e.g. tungsten is inserted in an insulating sintered body of, e.g. aluminum nitride. The resisting heat generating body is supplied with desired power from a power supply 81 via a filter 80 over a power supply lead 79. Thus, the heat generating body heats the processing surface of the wafer W up to a desired temperature, thereby controlling the temperature of the processing surface.

The table 74 has a disk-shape with a projecting upper central portion. This upper central portion is provided with, e.g. an electrostatic chuck 82 having a diameter substantially equal to, preferably slightly less than, the diameter of the wafer W. The electrostatic chuck 82, serving as a surface for holding the wafer W, comprises an electrostatic chuck sheet in which a conductive film 82c of, e.g. copper foil is sandwiched between two films 82a and 82b of a high polymer insulating material such as polyimide resin. The conductive film 82c is connected to a variable DC voltage source 85 through a filter 84 for cutting off high frequency waves, e.g. a coil, by a voltage supply lead 83. When a high voltage is applied to the conductive film 82c, the wafer W is attracted and held on the upper surface of the upper film 82a of the electrostatic chuck 82 by coulomb force. The electrostatic chuck 82 used as chuck means for holding the substrate to be processed may be replaced with mechanical chuck means for mechanically holding the substrate to be processed, e.g. a vertically movable, annular clamping member.

Heat transmission gas supply holes 86 are concentrically formed in the electrostatic chuck 82. The heat transmission gas supply holes 86 are connected to a heat transmission gas supply pipe 87. A heat transmission gas such as helium is supplied from a gas source (not shown) to a small space defined between the bottom surface of the wafer W and the chuck surface of the electrostatic chuck 82, thereby enhancing the heat transmission efficiency from the table 74 to the wafer W.

An annular focus ring 87 is disposed on a peripheral portion of the table 74 so as to surround the outer periphery of the wafer W on the electrostatic chuck 82. The focus ring 87 is formed of an insulating or conductive material which does not attract reactive ions so that the reactive ions may be effectively directed to the semiconductor wafer W alone situated inside the ring 87.

An electrically conductive hollow power supply rod 88 is connected to the table 74. A high-frequency power supply 90 is connected to the power supply rod 88 via a blocking capacitor 89. At the time of the process, a high-frequency power of, e.g. 13.56 MHz is applied to the table 74. With this structure, the table 74 functions as a lower electrode and a glow discharge is produced between the lower electrode and an upper electrode 91 situated to face the wafer W. Thereby, the process gas introduced into the casing 72 is converted to a plasma, and the substrate is subjected to etching by the stream of the plasma.

The upper electrode 91 is situated above the support surface of the table 74 at a distance of about 10 to 20 mm therebetween. The upper electrode 91 is made hollow and a process gas supply pipe 92 is connected to the hollow portion of the electrode 91. A predetermined process gas, e.g. an etching gas such as $CF_4$, is introduced through the supply pipe 92 from a process gas source 93 via a mass flow controller (MFC) 94. A baffle plate 95 having many small holes for facilitating uniform diffusion of the process gas is situated in a middle region of the hollow part of the upper electrode 91. A process gas introducing member 97 formed of a plate member having many small holes 96 as process gas jet holes is provided below the baffle plate 95.

An exhaust port 98 communicating with an exhaust system comprising a vacuum pump, etc. is formed at a lower part of the casing 72. Thus, the inside of the casing 72 can be evacuated to a predetermined pressure, e.g. 0.5 Torr. A baffle plate 99 having baffle holes is provided between the table 74 and the inner wall of the casing 72 so as to surround the table 74. The baffle plate 99 is also called "protect ring" or "exhaust ring," and it functions to rectify the flow of the exhaust gas and uniformly exhaust the process gas from the casing 72.

Figure 7:
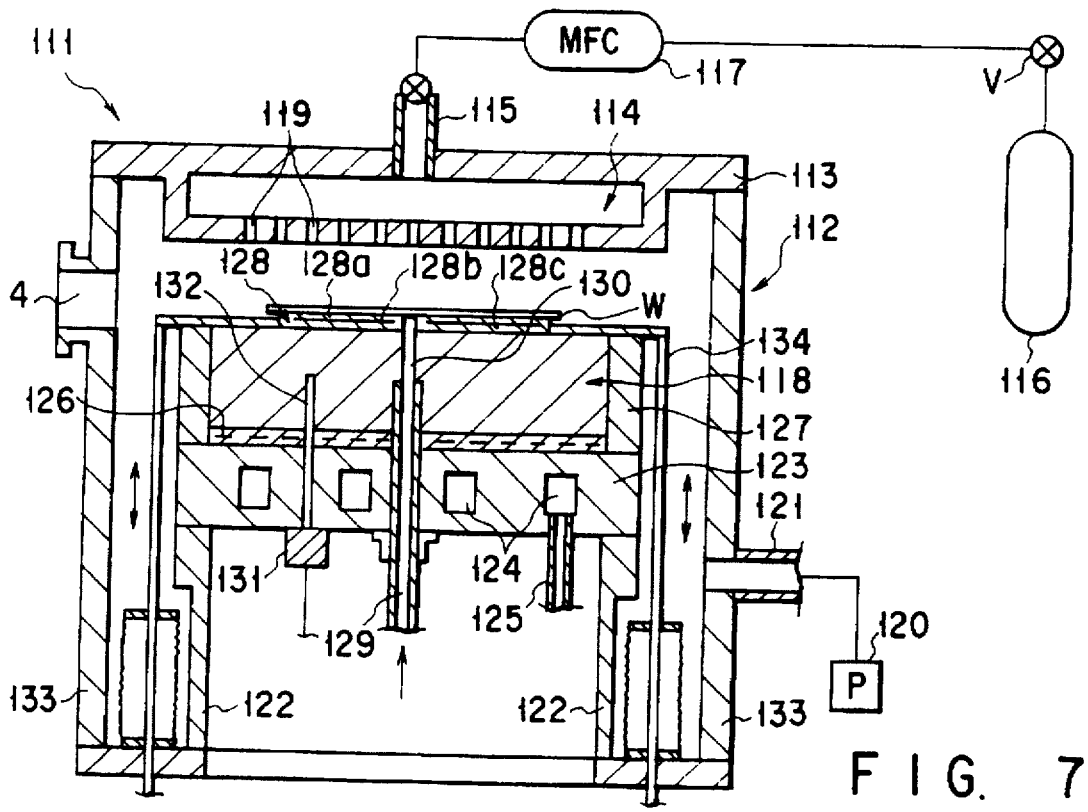
FIG. 7 is a cross-sectional view showing a CVD apparatus which can be used as a process unit.

FIG. 7 shows a multi-chamber thermal CVD apparatus 111 used as process unit U1, U5. The CVD apparatus 111 has a substantially cylindrical, air-tight casing 112 which can be evacuated to a predetermined negative pressure. A hollow cylindrical shower head 114 is air-tightly provided on a central area of a ceiling 113 of the casing 112. A process gas supply pipe 115 is connected to an upper part of the shower head 114, and a predetermined process gas is introduced into the shower head 114 from a process gas source 116 via a mass flow controller (MFC) 117. Gas jet ports 119 are formed in the lower surface of the shower head 114, which is opposed to a table 118 (described later). The process gas introduced into the shower head 114 through the process gas supply pipe 115 is uniformly discharged towards the table 118 within the casing 112 via the gas jet ports 119.

An exhaust pipe 121 communicating with exhaust means 120 such as a vacuum pump is provided near a bottom portion of the casing 112. By the function of the exhaust means 120, the inside of the casing 112 can be set and kept at a predetermined negative pressure, e.g. $10^{-6}$ Torr. The bottom portion of the casing 112 is formed of a bottom plate 123 supported by a substantially cylindrical support member 122. A cooling water reservoir 124 is provided within the bottom plate 123, and cooling water supplied through a cooling water pipe 125 is circulated in the cooling water reservoir 124.

The table 118 is provided on the upper surface of the bottom plate 123 with a heater 126 interposed. The heater 126 and the table 118 are surrounded by a heat insulating wall 127. A wafer W is placed on the table 118. The surface of the heat insulating wall 127 is mirror-polished and reflects incident radiation heat, thereby effecting heat insulation. The heater 126 is constituted such that a substantially strip-like heat generation body is buried in an insulating body in a predetermined pattern, e.g. in a spiral pattern. A voltage is applied from an AC power supply (not shown) provided outside the casing 112 to the heater 126 and the heater 126 is heated up to a predetermined temperature, e.g. 400° C. to 2000° C., thus maintaining the temperature of the wafer W placed on the table 118 at a predetermined degree, e.g. 800° C.

An electrostatic chuck 128 for electrostatically contacting and holding the wafer W is provided on the upper surface of the table 118. The electrostatic chuck 128, serving as a surface for holding the wafer W, comprises an electrostatic chuck sheet in which a conductive film 128c of, e.g. copper foil is sandwiched between two films 128a and 128b of a high polymer insulating material such as polyimide resin. The conductive film 128c is connected to a variable DC voltage source (not shown). When a high voltage is applied to the conductive film 128c, the wafer W is attracted and held on the upper surface of the upper film 128a of the electrostatic chuck 128 by coulomb force.

A heat transmission medium supply pipe 129 penetrating the bottom plate 123 is fitted in a central portion of the table 118. The heat transmission medium, e.g. He gas, is guided via a flow path 130 connected to an end portion of the heat transmission medium supply pipe 129 and is supplied to the bottom surface of the wafer placed on the support surface of the electrostatic chuck 128.

A sensing portion 132 of a temperature sensor 131 is situated in the table 118, and successively detects the temperature within the table 118. Based on a signal from the temperature sensor 131, AC power supplied to the heater 126 is controlled to maintain the support surface of the table 118 at a desired temperature.

A lifter 134 for vertically moving the wafer W placed on the support surface of the table 118 is provided within a substantially annular space defined by the peripheral side surface of the heat insulating wall 127, the peripheral side surface of the bottom plate 123, the peripheral side surface of the support member 122 and the inner peripheral surface of a side wall 133 of the casing 112.

Figure 8:
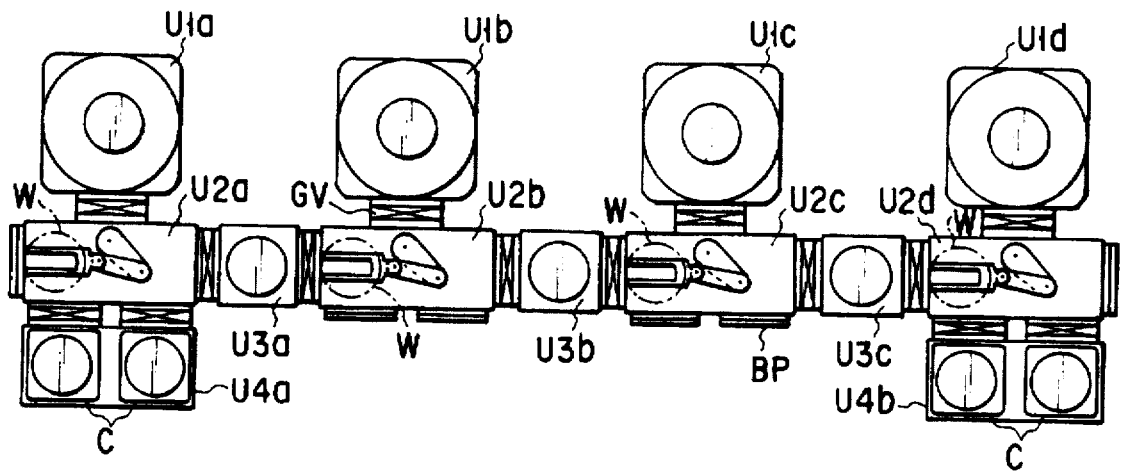
FIG. 8 is a plan view showing a multi-chamber type process system according to still another embodiment of the present invention.

With reference to FIG. 8, a description will now be given of an embodiment of a multi-chamber type process system wherein the above-described process apparatuses are used as process units U1 and a wiring material is provided in contact holes. In FIG. 8, a process unit U1a is an etching unit having the structure of the etching apparatus 71. Process units U1b and U1c are first and second sputtering units each having the structure of the sputtering apparatus 40, and a process unit U1d is a CVD unit having the structure of the CVD apparatus 111.

As was described in connection with the embodiments shown in FIGS. 1 and 2, the process units U1a, U1b, U1c and U1d are connected to associated transfer units U2 (denoted by numerals U2a, U2b, U2c and U2d in FIG. 8) via gate valves GV. The transfer units U2 are interconnected by interconnection units U3 (denoted by numerals U3a, U3b and U3c in FIG. 8) via gate valves GV. The rightmost and leftmost transfer units U2a and U2d in FIG. 8 are connected to in/out units U4 (denoted by numerals U4a and U4b in FIG. 8) via gate valves GV. As has been described above, the units U1 to U4 are individually connected to the inert gas supply system and exhaust system and can be independently set at a predetermined negative pressure. The non-used openings of the transfer units U2 are air-tightly sealed by blind plates BP.

A general description will now be given of the operation of the multi-chamber type process system shown in FIG. 8, wherein through-holes are formed in an interlevel insulating film of a silicon oxide film formed on the silicon wafer W and a titanium film, a titanium nitride film and a tungsten film are formed as wiring elements on the wafer W as well as in the through-holes.

At first, the wafer cassette C storing non-processed wafers W is introduced into the left-hand in/out unit U4a in the above-described manner. One of the wafers W is taken out from the wafer cassette C in the in/out unit U4a by the transfer arm 12 of the transfer unit U2a. The taken-out wafer W is aligned on the basis of an orientation flat formed on the wafer W, and then transferred into the etching unit U1a. Subsequently, a voltage is applied between counter electrodes 74 and 91 (see FIG. 6) of the etching unit U1a to cause a glow discharge. Thereby, the process gas is converted to a plasma. Using ion species and active species of the plasma, the interlevel insulating film is etched to form through-holes.

After the etching process is completed, the wafer W is taken out of the etching unit U1a by the transfer arm 12 of the transfer unit U2a and transferred into the interconnection unit U3a. For example, ozone is introduced into the interconnection unit U3a, and the etched substrate is subjected to ashig as post-treatment. In the interconnection unit U3a, a specific process such as a test, temperature control or alignment is performed on an as-needed basis.

After the specific process is completed in the interconnection unit U3a, the wafer W is taken out of the interconnection unit U3a by the transfer arm 12 of the transfer unit U2b and transferred into the first sputtering unit U1b. Then, the wafer W is heated up to a desired temperature, e.g. 200° C., on the table 45 (see FIG. 5) of the first sputtering unit U1b. Then, a high DC voltage of, e.g. 10 to 20 KW, is applied between the electrodes 42 and 45 to cause a glow discharge and an inert gas such as argon is converted to a plasma. Thus, ion particles are let to impinge upon the target 43 of titanium bonded to the lower surface of the cathode. Titanium particles emitted from the target 43 are coated on the processing surface of the wafer W opposed to the target 43. In this manner, a titanium film is formed as an ohmic contact layer on the wafer W as well as in the through-holes formed by the etching.

After the titanium film is formed, the wafer W is taken out of the first sputtering unit U1b, by the transfer arm 12 of the transfer unit U2b and transferred into the interconnection unit U3b. In the interconnection unit U3b, a specific process such as a test, temperature control or alignment is performed on an as-needed basis.

After the specific process is completed in the interconnection unit U3b, the wafer W is taken out of the interconnection unit U3b by the transfer arm 12 of the transfer unit U2c and transferred into the second sputtering unit U1c. Then, the wafer W is heated up to a desired temperature, e.g. 200° C., on the table 45 (see FIG. 5) of the second sputtering unit U1c. Then, a high DC voltage of, e.g. 10 to 20 KW, is applied between the electrodes 42 and 45 to cause a glow discharge and nitrogen gas is converted to a plasma. Thus, ion particles are let to impinge upon the target 43 of titanium bonded to the lower surface of the cathode. Titanium particles emitted from the target 43 are nitrided and coated on the processing surface of the wafer W opposed to the target 43. In this manner, a titanium nitride film is formed as a barrier layer on the already formed titanium film.

After the titanium nitride film is formed, the wafer W is taken out of the second sputtering unit U1c by the transfer arm 12 of the transfer unit U2c and transferred into the interconnection unit U3c. In the interconnection unit U3c, a specific process such as a test, temperature control or alignment is performed on an as-needed basis.

After the specific process is completed in the interconnection unit U3c, the wafer W is taken out of the interconnection unit U3c by the transfer arm 12 of the transfer unit U2d and transferred into the CVD unit U1d. Then, the wafer W is heated up to a desired temperature, e.g. 800° C. on the table 118 (see FIG. 7) of the CVD unit U1d. Then, a tungsten-containing gas is introduced into the casing 112, and a tungsten film is formed on the already formed titanium nitride film by a CVD method. In this manner, a wiring material consisting of the titanium film, titanium nitride film and tungsten film is provided on the wafer W as well as in the through-holes formed therein.

After the titanium nitride film is formed, the wafer W is taken out of the CVD unit U1d by the transfer arm 12 of the transfer unit U2d and the processed wafer W is inserted into the wafer cassette C in the right-hand in/out unit U4b. After the wafer cassette C is filled with processed wafers W, it is taken out of the present process system. Although not shown, the process system may be constituted such that another interconnection unit U3, in which the state of film formation can be examined, is provided on the other side of the final-stage transfer unit U2d. Furthermore, the process system may be constituted by another process unit for performing after-treatment such as etch-back treatment.

According to the present invention, the multi-chamber type process system may be variously designed under given conditions, by changing the transfer path so as to avoid various obstacles.

Figure 9:
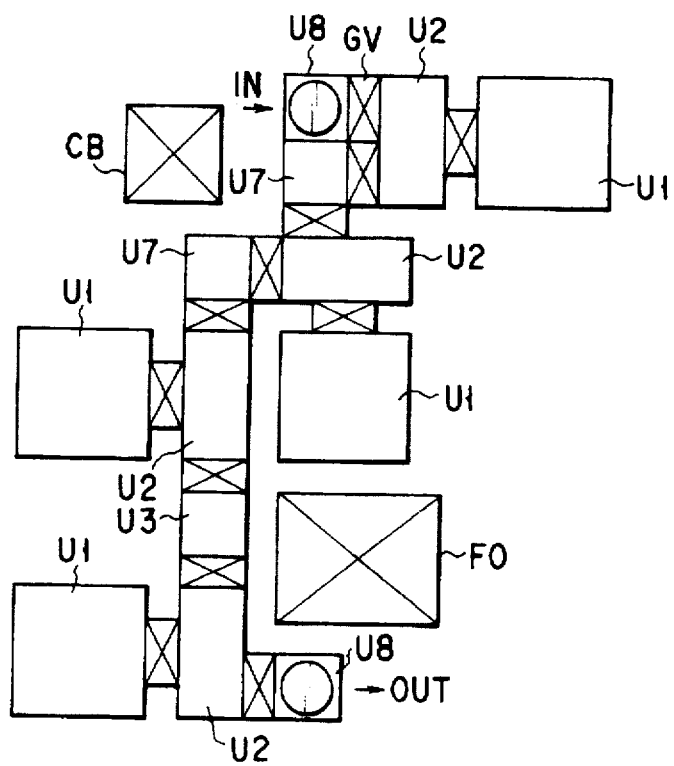
FIG. 9 is a plan layout view showing a multi-chamber type process system according to still another embodiment of the present invention.
Figure 10:
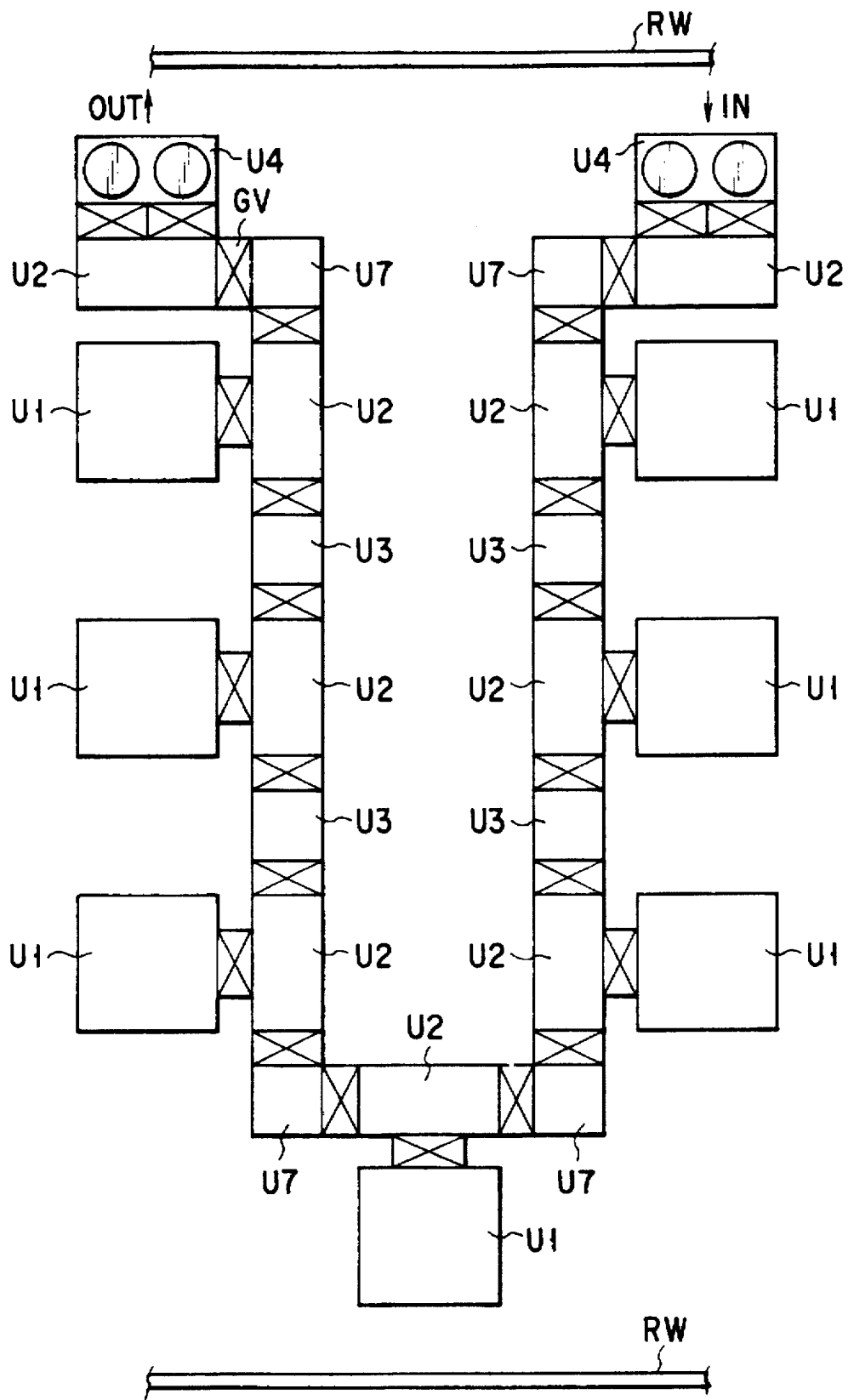
FIG. 10 is a plan layout view showing a multi-chamber type process system according to still another embodiment of the present invention.
Figure 11:
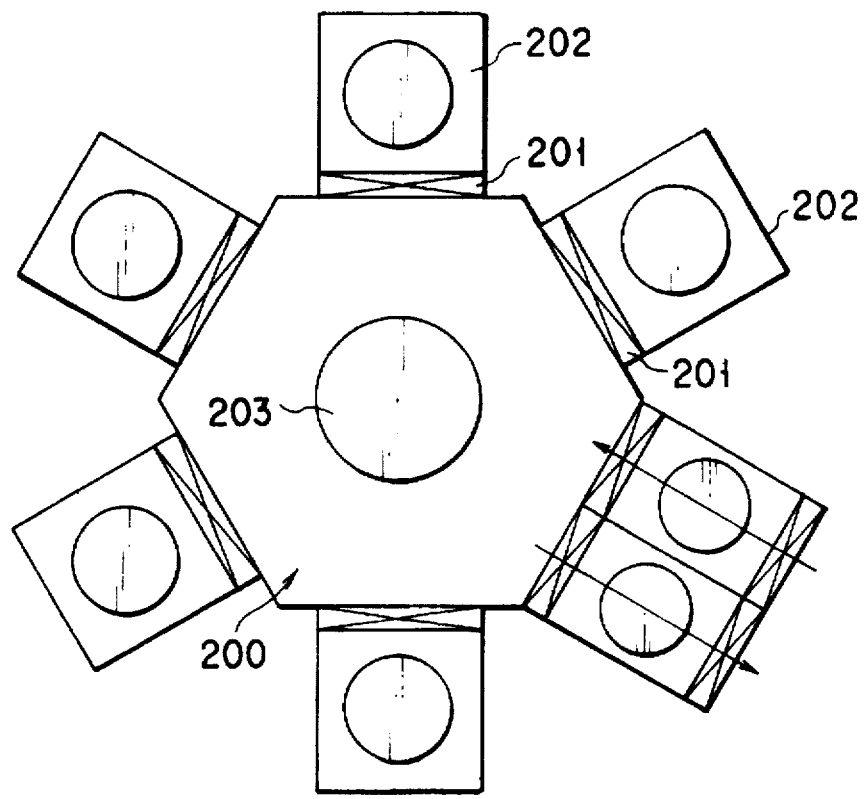
FIG. 11 is a schematic plan view showing a conventional multi-chamber type process system.
Figure 12:
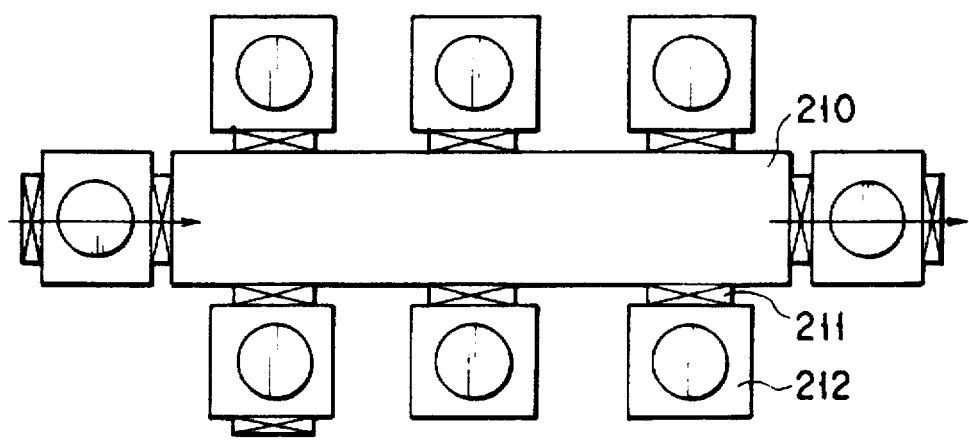
FIG. 12 is a schematic plan view showing another conventional multi-chamber type process system.

For example, in the embodiment having a layout shown in FIG. 9, a multi-chamber type process system is formed in a zigzag shape so as to avoid a column CB and a fixed object FO. In the process system shown in FIG. 9, for example, an upper in/out unit U8 for storing one cassette is used as an entrance section and a lower in/out unit U8 for storing one cassette is used as an exit section. In an embodiment having a layout shown in FIG. 10, many process units, i.e. nine process units U1, are arranged in a U shape via transfer units U2 and interconnection units U3 and U7, so that the units U1 can be accommodated in a space defined by opposed walls RW of a room. In the process system shown in FIG. 10, for example, a right-hand in/out unit U4 for storing two cassettes is used as an entrance section of the system and a left-hand in/out unit U4 for storing two cassettes is used as an exit section of the system.

As has been described above, the present invention can provide a multi-chamber type process system wherein transfer units are successively connected via interconnection units and a desired number of process units for freely chosen processes are used. In this case, the inert gas supply system and exhaust system, which are required for the individual process units, are provided separately for each unit. Thus, no excessive load is applied to the exhaust system of on specific unit. Accordingly, unlike the conventional systems, the type and number of process chambers to be provided are not limited by the shape and performance of the vacuum transfer system. Furthermore, after the multi-chamber process system of the present invention is constructed, other process units can be added and the initially provided process units can be changed or removed. Besides, in the present process system, the closed space is created from the take-in to the take-out of the wafer cassette, and there is no need to situate the process system in a clean room with high cleanness. Accordingly, the degree of freedom of design of the present process system is very high.

According to the present invention, the interconnection unit may be provided with various functions of tests, alignment, temperature control, etc., as shown in FIG. 3, thereby performing the tests, alignment, temperature control, etc. during the transfer of wafers and greatly enhancing the through-put of the system.

FIGS. 5 to 7 show, as process units, the sputtering apparatus, etching apparatus and thermal CVD apparatus. However, such process units include various apparatuses used in semiconductor processes, e.g. a plasma CVD apparatus, an RPT (rapid thermal process) apparatus, an annealing apparatus, an ashing apparatus, an oxide film forming apparatus, and a heat treatment apparatus. The substrates to be subjected to semiconductor processes include LCD substrates, in addition to semiconductor wafers.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor process system for processing a plurality of substrates, comprising:

first and second process units each having a process casing with at least one opening through which each of the substrates can pass, support means for supporting each of the substrates within the process casing, and means for subjecting each of the substrates to a semiconductor process within the process casing;

first and second transfer units each having a transfer casing with at least four openings through which each of the substrates can pass, and a transfer arm, provided within the transfer casing, for transferring each of the substrates, said first and second transfer units being connected to said first and second process units via joints, respectively, said joints connecting the adjoining openings of the two associated units openably and air-tightly;

an interconnection unit having an interconnection casing with at least two openings through which each of the substrates can pass, and a table, provided within the interconnection casing, for supporting each of the substrates, said interconnection unit being connected to said first and second transfer units via joints, said joints connecting the adjoining openings of the two associated units openably and air-tightly; and an in/out unit having an in/out casing with at least one opening through which each of the substrates can pass, and vertical movement means for vertically moving at least one cassette storing said substrates at intervals within the in/out casing, said in/out unit being connected to said first transfer unit via a joint, said joint connecting the adjoining openings of the two associated units openably and air-tightly, wherein the opening of each of said units is situated such that said units are connected in directions defined in units of substantially 90°, and the direction of transfer of the substrates is defined in units of substantially 90°, openings of the casings of said process units, said transfer units and said interconnection unit, which are not connected to any of the other openings of the casings, are air-tightly closed by blind plates such that each of the casings of said process units, said transfer units and said inter-connection unit form a vacuum chamber, said joints comprise gate valves having common mounting dimensions, said first and second process units have an installation floor space of substantially a same square, said first and second transfer units have a substantially same size and structure, and have an installation floor space smaller than that of said first and second process units, each of said process units and each of said transfer units connected thereto face each other to have a width of an installation floor space substantially a same as each other and have aligned centers, said interconnection unit has an installation floor space smaller than that of said first and second transfer units, said interconnection unit and each of said transfer units face each other to have a width of an installation floor space substantially a same as each other and to have aligned centers, and said first process unit and said first transfer unit constitute a first process section having only one process unit and only one transfer unit, while said second process unit and said second transfer unit constitute a second process section having only one process unit and only one transfer unit.

2. The system according to claim 1, wherein an inert gas supply system and an exhaust system are connected to each of the casings of said process units, said transfer units and said interconnection unit and the internal pressure of each of the casings can be independently controlled.

3. The system according to claim 2, wherein the casing of said in/out unit constitutes a vacuum chamber, an inert gas supply system and an exhaust system are connected to the casing of said in/out unit, and the internal pressure of the casing of the in/out unit can be independently controlled.

4. The system according to claim 3, wherein said cassette is fed to said in/out unit in a state in which said cassette is stored in a container filled with an inert gas, said container having a container body with an open end portion, and a bottom plate for closing the open end of the container body and supporting said cassette, and said in/out unit further comprises means for creating a closed space in cooperation with said container body, and while said closed space is created, said bottom plate is moved from said container body by means of said vertical movement means and said cassette is taken into the casing of the cassette from the container.

5. The system according to claim 1, wherein said interconnection unit has two said openings situated in two directions defined at 180° or in two directions defined at 90°.

6. The system according to claim 1, wherein said interconnection unit includes means for subjecting said substrates to at least one specific treatment selected from the group consisting of tests, alignment, temperature control and film formation.

7. The system according to claim 1, wherein the casing of said in/out unit has two said openings and said vertical movement means is capable of vertically moving two said cassettes.

8. The system according to claim 1, wherein an in/out unit, which is substantially identical to said in/out unit, is connected to said second transfer unit via a joint.

9. The system according to claim 1, wherein each of said units is basically designed to have an installation floor space corresponding to an N number (N=a positive integer of four or less) of times of a reference square.

10. A semiconductor process system for processing a plurality of substrates, comprising:

(a) a plurality of process kits each designed to have substantially a same installation floor space, said process kits each having only one process unit and only one transfer unit connected to each other, the process units of said process kits being designed to have an installation floor space of substantially a same square, the transfer units of said process kits being designed to have a substantially same size and structure, and to have an installation floor space smaller than that of each of said process units, each of said process units and each of said transfer units connected thereto facing each other to have a substantially same width of an installation floor space as each other and to have aligned centers, said process units each having a process casing with at least one opening through which each of the substrates can pass, support means for supporting each of the substrates within the process casing, and means for subjecting each of the substrates to a semiconductor process within the process casing, said transfer units each having a transfer casing with at least four openings through which each of the substrates can pass, and a transfer arm, provided within the transfer casing, for transferring each of said substrates, said transfer units being respectively connected to said process units via a gate valve, which connects the adjoining openings of the two associated units openably and air-tightly;

(b) an interconnection unit connecting a pair of said transfer units which belong to two adjacent process kits, said interconnection unit being designed to have an installation floor space smaller than that of each of said transfer units, said interconnection unit and each of said transfer units facing each other to have a substantially same width of an installation floor space as each other and to have aligned centers, said interconnection unit having an interconnection casing with at least two openings through which each of the substrates can pass, and a table, provided within the interconnection casing, for supporting each of the substrates, said interconnection unit being connected to said transfer units via a gate valve which connects adjoining openings of the two associated units openably and air-tightly; and (c) an in/out section connected to at least one selected transfer unit, which belongs to one of said process kits to transfer the substrates into and from said selected transfer unit, said in/out section having at least one opening through which each of the substrates can pass, and being connected to said selected transfer unit via a gate valve, which connects adjoining openings of two associated units openably and air-tightly, wherein the openings of each of said units is situated such that said units are connected in directions defined in units of substantially 90°, and a direction of transfer of the substrates is defined in units of substantially 90°, the openings of the casings of said process units, said transfer units and said interconnection unit, which are not connected to any of the other openings of the casings, are air-tightly closed by blind plates such that each of the casings of said process units, said transfer units and said interconnection unit form a vacuum chamber, and said gate valves have common mounting dimensions.

11. The system according to claim 10, wherein an inert gas supply system and an exhaust system are connected to each of the casings of said process units, said transfer units and said interconnection unit and the internal pressure of each of the casings can be independently controlled.

12. The system according to claim 10, wherein said interconnection unit has two said openings situated in two directions defined at 180° or in two directions defined at 90°.

13. The system according to claim 10, wherein said interconnection unit includes means for subjecting said substrates to at least one specific treatment selected from the group consisting of tests, alignment, temperature control and film formation.

14. The system according to claim 10, wherein each of said units is basically designed to have an installation floor space corresponding to an N number (N=a positive integer of four or less) of times of a reference square.

* * * * *